United States Patent [19]

Hunsinger

[11] Patent Number: 5,144,262
[45] Date of Patent: Sep. 1, 1992

[54] ACOUSTIC CHARGE TRANSPORT SELECTABLE DELAY LINE AND DELAY LINE OSCILLATOR FORMED THEREWITH

[75] Inventor: Billy J. Hunsinger, Urbana, Ill.

[73] Assignee: Electronic Decisions Incorporated, Urbana, Ill.

[21] Appl. No.: 420,109

[22] Filed: Oct. 10, 1989

[51] Int. Cl.$^5$ .................... H03B 5/20; H03H 9/68; H01L 41/117

[52] U.S. Cl. .................. 331/107 A; 333/152; 333/165; 357/24; 310/313 R; 310/313 D

[58] Field of Search ................ 333/150–154, 333/165, 193–196; 310/313 R, 313 B, 313 C, 313 D; 357/24; 364/821; 331/107 A

[56] References Cited

U.S. PATENT DOCUMENTS

| | | | |
|---|---|---|---|
| 3,457,369 | 7/1969 | Davies et al. | 333/139 X |
| 3,873,946 | 3/1975 | Weglein | 333/153 |
| 3,940,720 | 2/1976 | Harrington | 333/150 |
| 3,962,652 | 6/1976 | Zarin et al. | 333/150 X |
| 3,979,700 | 9/1976 | Groce | 333/150 |
| 4,013,834 | 3/1977 | Kino et al. | 333/152 X |
| 4,100,498 | 7/1978 | Alsup et al. | 333/150 X |
| 4,207,545 | 6/1980 | Grudkowski et al. | 333/150 |
| 4,328,473 | 5/1982 | Montress et al. | 333/154 |
| 4,611,140 | 9/1986 | Whitlock et al. | 333/154 X |
| 4,633,285 | 12/1986 | Hunsinger et al. | 357/26 |
| 4,635,007 | 1/1987 | Magill | 333/153 |
| 4,665,374 | 5/1987 | Fathimulla | 333/196 |
| 4,739,290 | 4/1988 | Minarik et al. | 333/152 |
| 4,799,244 | 1/1989 | Mikoshiba et al. | 357/24 X |
| 4,926,146 | 5/1990 | Yen et al. | 333/154 X |

OTHER PUBLICATIONS

Smythe et al., "Integrated SAW/CCD signal processing devices"; *Proc Soc. Photo Optic Instruments;* (1979); pp. 152–158.

Feldman, M. et al.; "A new A/D converter using Surface Acoustic Waves"; IEEE Publication, 1978; pp. 456–459.

Panasik, C. M. et al.; "A 32 top digitally controlled Programmable Transversal/Filter", 1988 *Ultrasonics Symposium.*

Geuediri, F. et al.; "Preformance of Acoustic Charge Transport Programmable Tapped Delay Line"; 1987 *Ultrasonics Symposium,* pp. 11–14.

J. D. Maines et al., "Simple Technique for the Accurate Determination of Delay-Time Variation in Surface-Acoutic-Wave Structures", *Electronics Letters,* 5,678, (1969).

M. F. Lewis, "Some Aspects of SAW Oscillators", 1973 *Ultrasonic Symposium,* IEEE, 1973, pp. 344–347.

R. Bale et al., "Improvements to the SAW Oscillator", 1974 *Ultrasonic Symposium,* IEEE, 1974, pp. 272–275.

D. L. Lee, "Design Considerations for Electronically Compensated SAW Delay Line Oscillators," 1979 *Ultrasonic Symposium,* IEEE, 1979, pp. 849–854.

J. C. Thorpe et al., "2.148 GHz Surface Acoustic Wave Oscillator," 1979, *Ultrasonic Symposium,* IEEE, 1979, pp. 882–885.

N. A. Howard, "GHz Thick Film Hybrid SAW Oscillators," 1983 *Ultrasonics Symposium,* IEEE, 1983, pp. 283–286.

L. Eichinget et al., "A Two GHz Surface Transverse Wave Oscillator with Low Phase Noise" 1988, IEEE MIT-S Digest, IEEE, 1988, pp. 113–116.

Electronic Decisions Incorporated, "Analog-Digital Array Processor ACT Device Development", Jan. 1988.

*Primary Examiner*—Eugene R. LaRoche
*Assistant Examiner*—Benny Lee
*Attorney, Agent, or Firm*—Shlesinger, Arkwright & Garvey

[57] ABSTRACT

A delay device comprises a semi-conductor chip having acoustic charge transport channel disposed therein; a contact operably connected to and disposed at one end of the channel for injecting an electronic signal into the channel; a transducer for generating a single frequency, large amplitude acoustic surface wave through the channel for thereby transporting the electronic signal through the channel; a plurality of electrodes operably associated with the channel and disposed along the propagation path of the surface acoustic wave for non-destructively sensing the electronic signal; switches monolithically disposed on the chip and operably connected to the electrodes for preselecting any one of the electrodes, thereby extracting a delayed replica of the signal from the channel; and an output circuit for processing the extracted signal for generating an output.

29 Claims, 6 Drawing Sheets

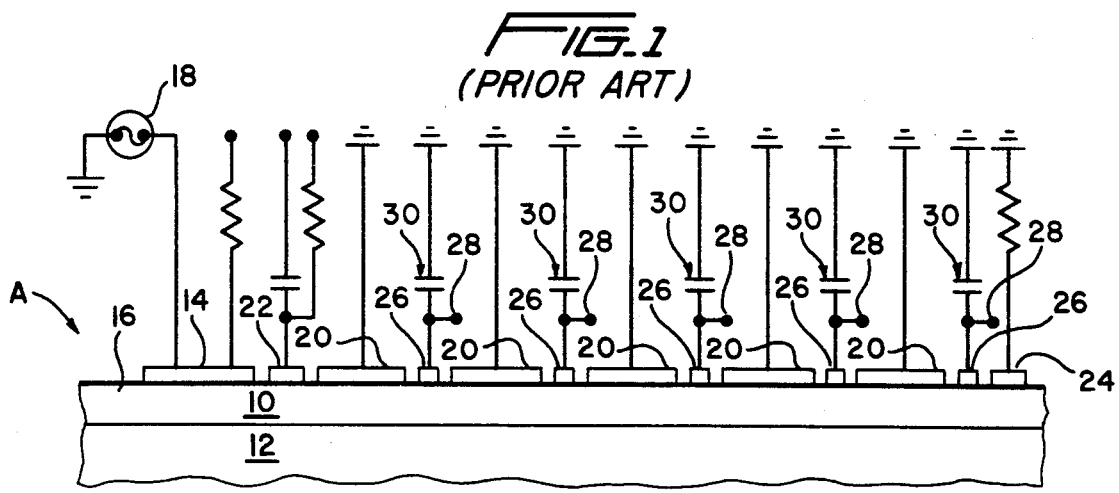
FIG. 1 (PRIOR ART)
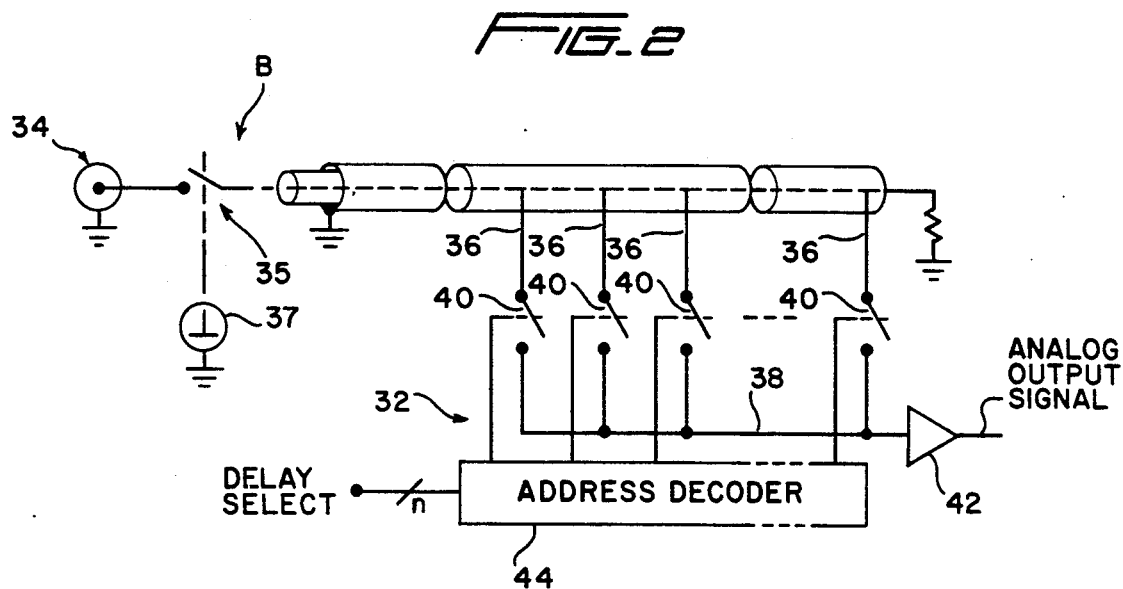
FIG. 2
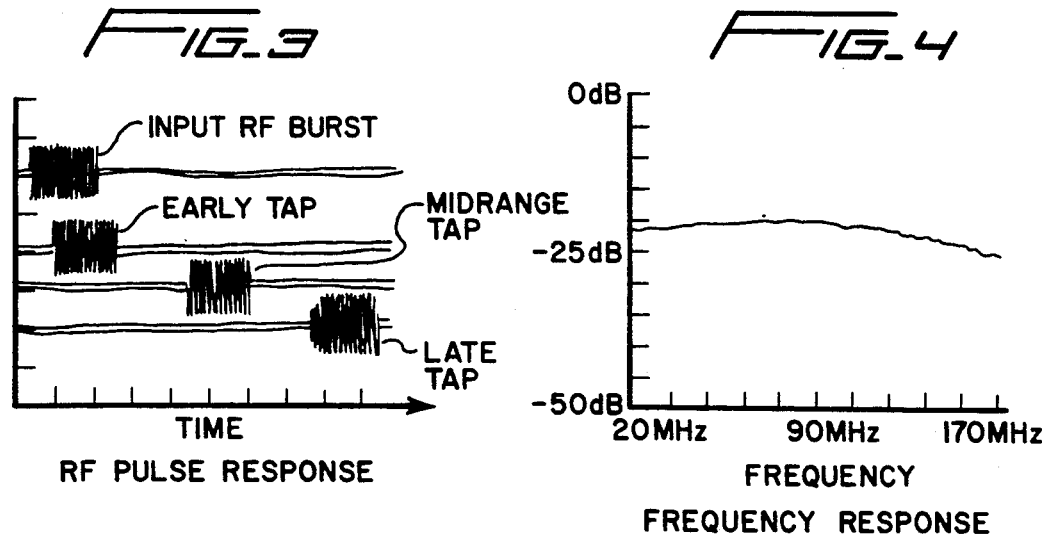
FIG. 3 — RF PULSE RESPONSE
FIG. 4 — FREQUENCY RESPONSE

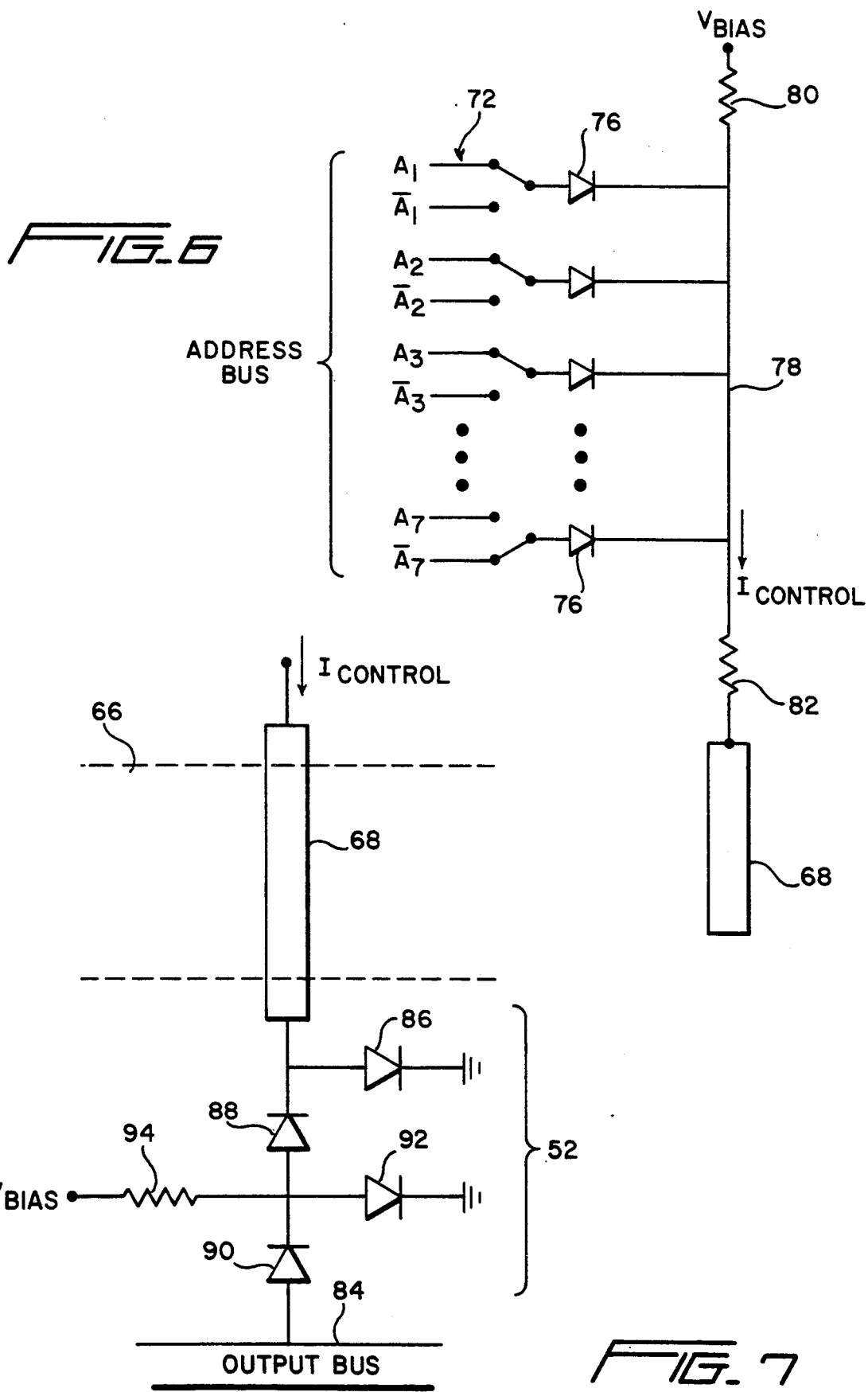

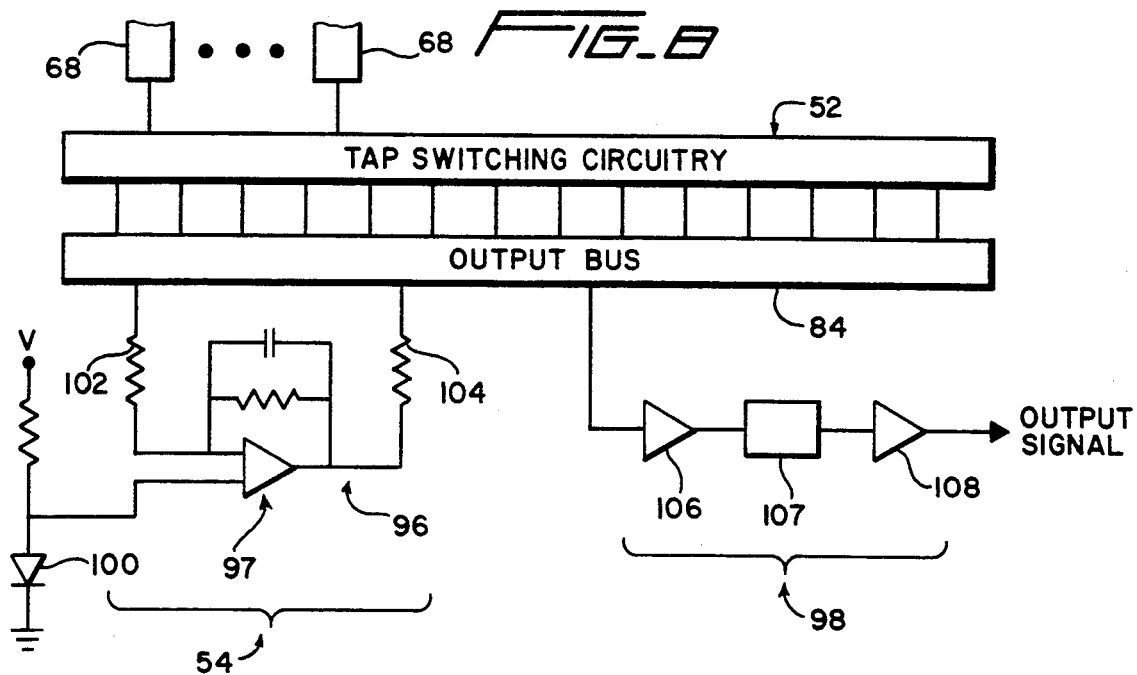
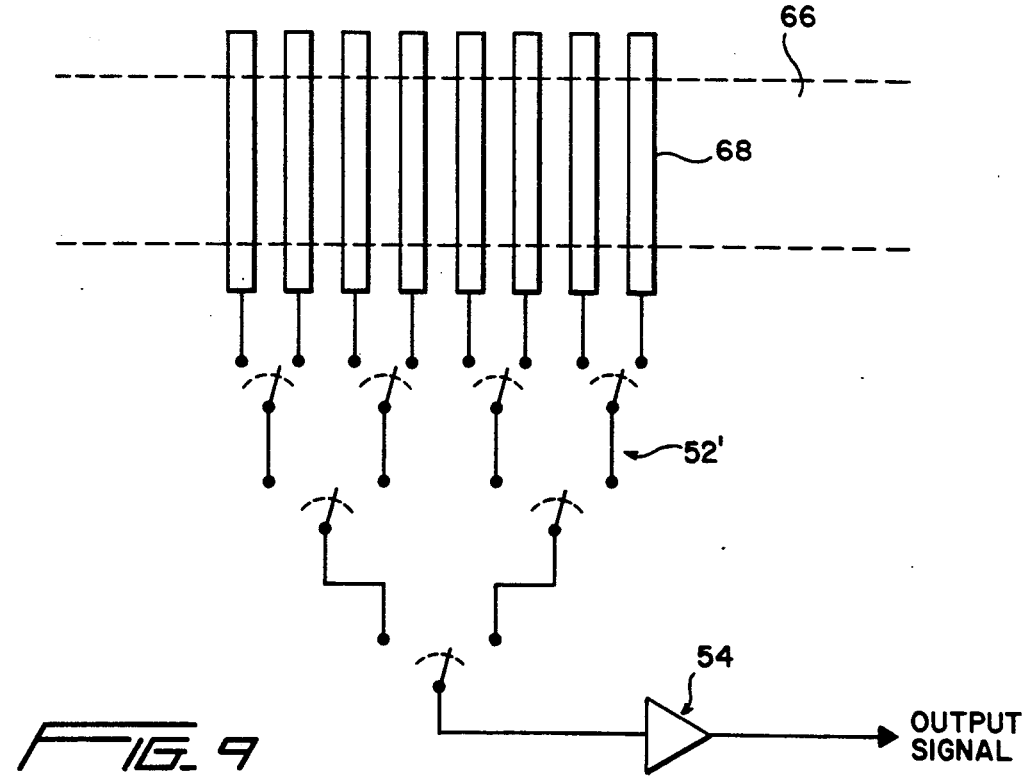

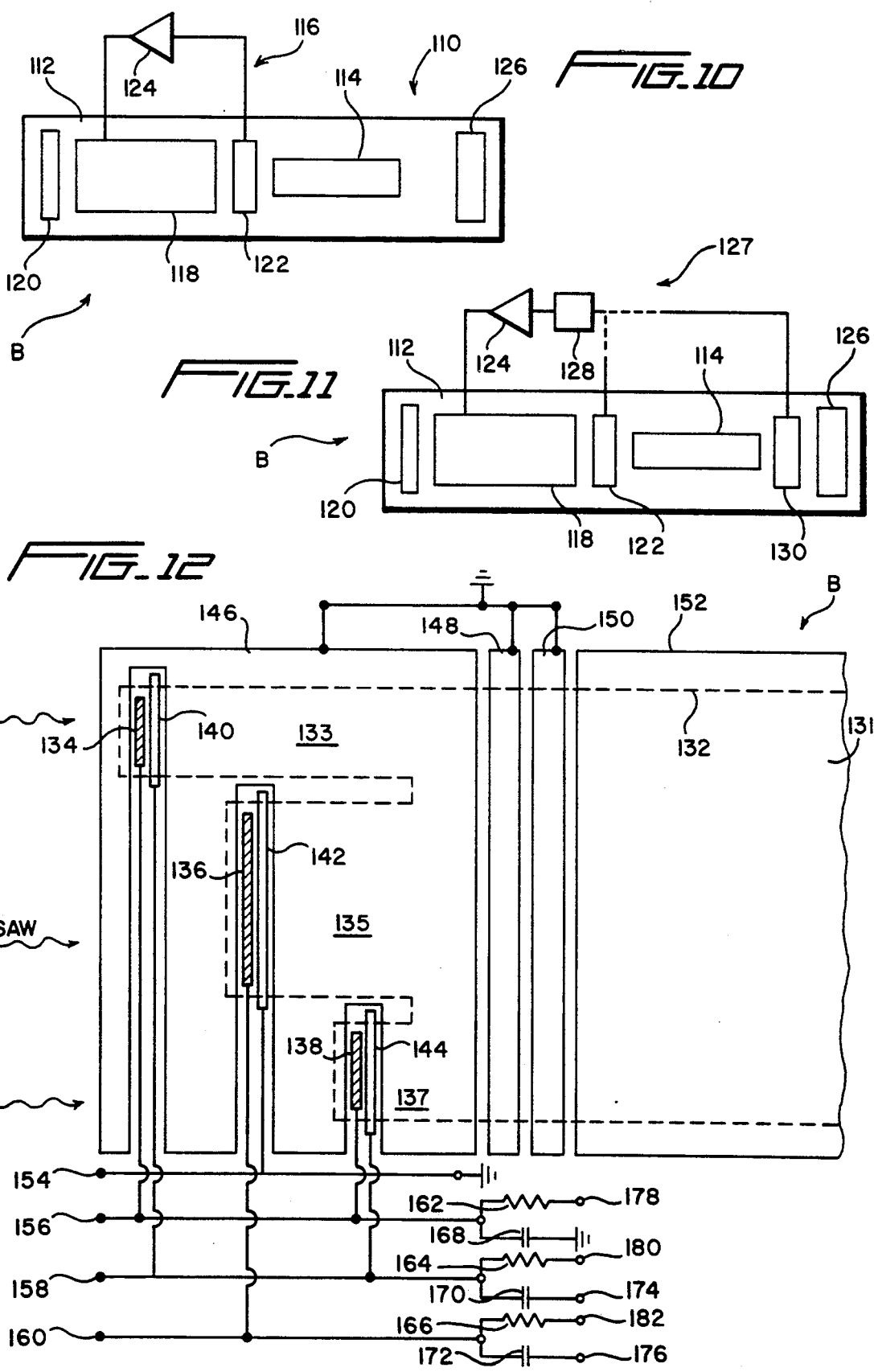

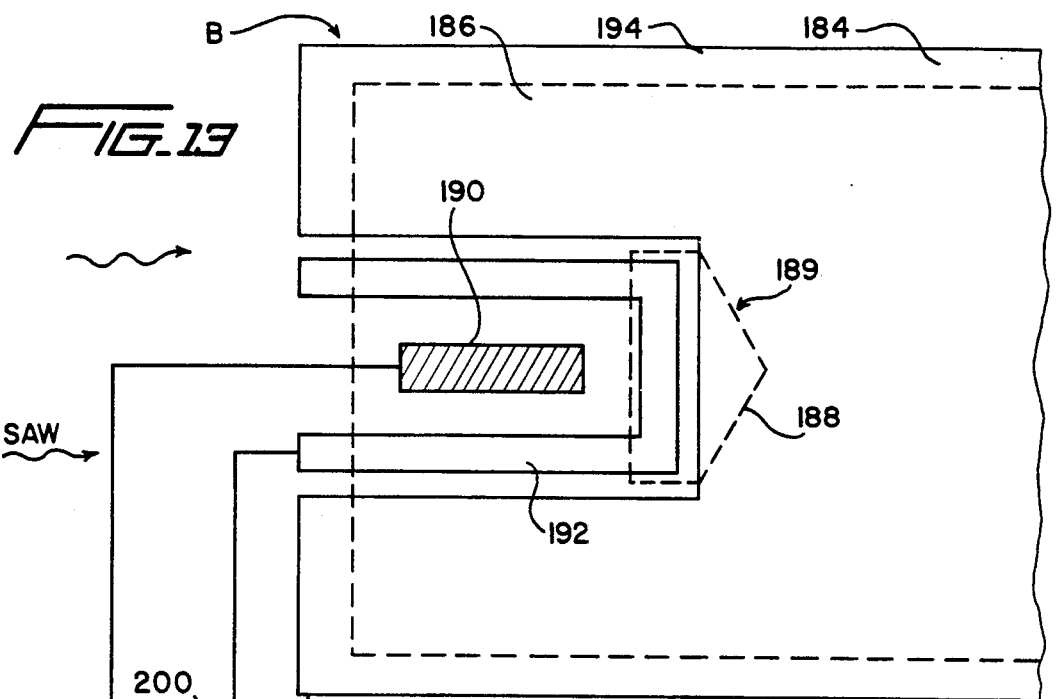
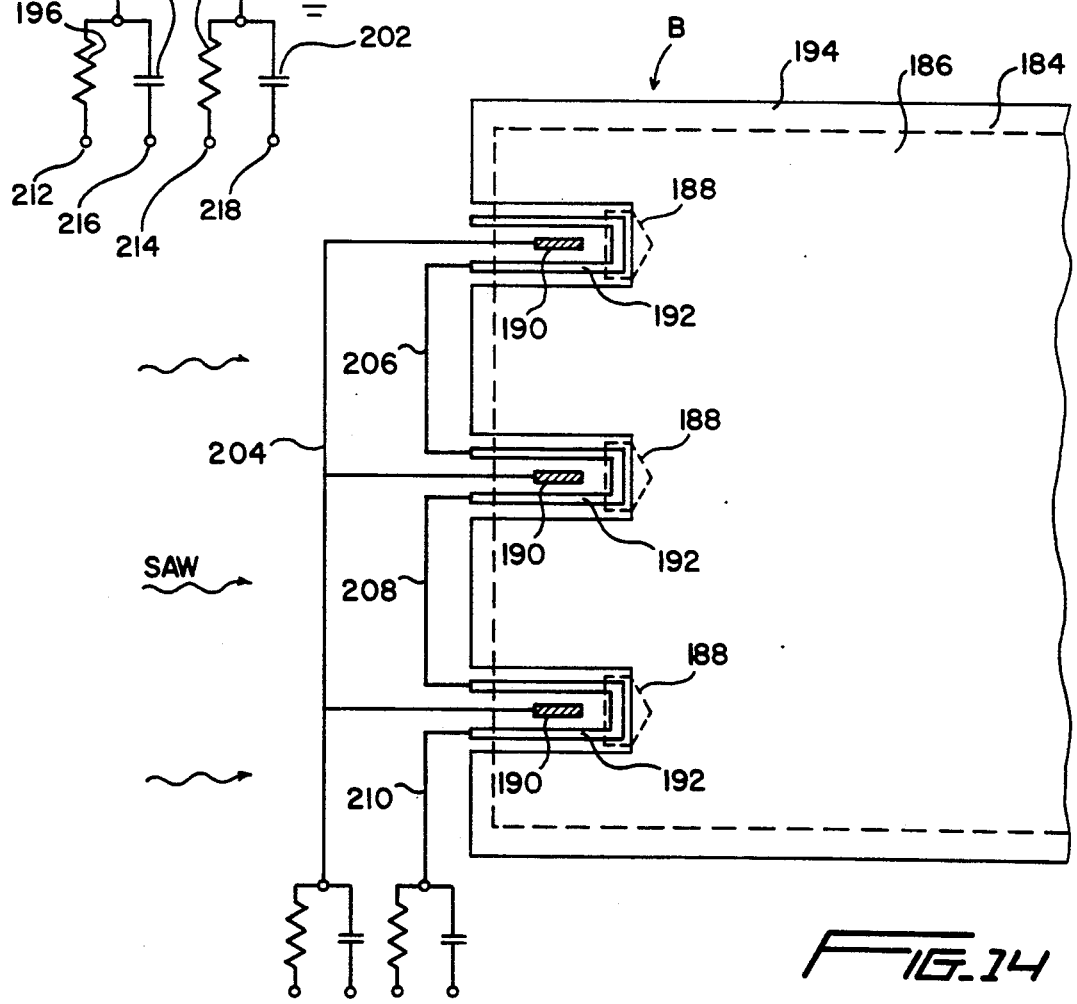

ACOUSTIC CHARGE TRANSPORT SELECTABLE DELAY LINE AND DELAY LINE OSCILLATOR FORMED THEREWITH

FIELD OF THE INVENTION

This invention was made with Government support under contract number F-30602-85-C-0170 awarded by the Department of Defense. The Government has certain rights in this invention.

The invention belongs to a general class of delay elements (cables, digital memories, surface acoustic wave (SAW) devices, etc.) used in radio frequency (RF) systems to implement the delay function.

BACKGROUND OF THE INVENTION

Selectable delay can be achieved by using RF switches to select different lengths of coaxial cables. The major problems with this approach are size and signal distortion. The propagation velocity of signals in cable is about $10^8$ meters per second; therefore, it takes about 100 meters of cable to delay signals by one microsecond. In addition, cables are typically dispersive (delay changes with frequency) and susceptible to reflections caused by impedance discontinuities. Significant signal distortion can result.

Selectable delay can also be effected with charge coupled devices which are time-sampled delay devices. The biggest difficult with the CCD's is that the sampling rate is relatively low. It is relatively difficult to make CCD's with sampling rates over 100 MHz (in silicon). In addition, although the sampling rate can be dynamically changed in a CCD (up to the limit of the chip), the delay is also changed when this occurs and distortion may also result. CCD's have not been widely used for selectable delay applications to our knowledge, and an additional reason for this is the difficulty in implementing such a function in a compact and user-friendly form. We are not aware of the existence of such a product, even in the lower frequency ranges where silicon CCD's are feasible.

Surface acoustic wave devices can be used to provide delay of signals with wide bandwidth. The two biggest difficulties in implementing selectable SAW delay lines are time-spurious signals and complexity of the tap-switching circuitry. Any spurious acoustic echoes or direct electromagnetic coupling of the input signal present in the SAW device output represent a signal distortion. These distortions are hard to control in wideband programmable SAW devices. Secondly, SAW devices are typically not constructed on semiconductor material, and therefore it is not possible to integrate the hundreds of active elements required to implement a multi-tap selectable delay line. Hybrid SAW selectable delay lines are quite complex and costly subsystems.

Signals can be delayed by inductor-capacitor (LC) networks designed as all-pass networks. The main difficulty with these delay lines is the dispersion that is inherent in the design. The dispersion can seriously distort pulse shapes in wideband applications. The problem of effectively changing the delay of such networks dynamically is also not easily solved.

Signals can be delayed utilizing A/D converters, high-speed digital memory, and D/A converters. The process of converting signals to digital form, storing and recalling them, and then converting back to analog is complex and requires a complex system to implement. The main difficulties with this approach are speed limitations presented by the A/D and D/A converters and other digital components, high system complexity required to implement it, and signal distortion resulting from the digitization process. DRFM's are complicated delay and signal processing systems used in electronic warfare (EW) applications which are quite large and very costly, mainly because of the complexity of utilizing the digital delay approach.

In the past, ACT devices have been operated with adjustable frequency generators and large power amplifiers. The frequency of operation of the SAW acoustic system had to be known before-hand for specific delivered RF powers and ambient temperature conditions or adjusted manually in situ. No fixed frequency RF oscillator/power amplifier could be expected to operate even the same type of ACT device because of frequency differences due to variations in manufacture or materials used in fabrication. Thermal control systems could be used to actively force the IC substrate to operate at a specific temperature (and consequently a constant frequency) but would be more complex and consume significantly greater amounts of electrical power. Alternately, multiple pick-up transducers could be used in the SAW path to hold the delay line phase response constant (and hence a constant number of wavelengths) in a negative feedback system using an electrical control system (phase detector controlling a variable phase shifter in the loop) and/or in combination with a thermal control system. Again, such a system is more complicated.

OBJECTS AND SUMMARY OF THE INVENTION

It is therefore an object of the present invention to provide a high performance selectable (programmable) delay capability in a compact and user-friendly form. It can be used for moderate level analog signals (up to +6 dBm) in the 20 to 170 MHz frequency range.

It is another object of the present invention to provide an analog delay line module whose delay can be externally selected. The module is realized using Acoustic Charge Transport (ACT) technology methods and capabilities.

It is still another object of the present invention to provide a high-frequency delay capability that may replace or augment a number of previous delay technologies, such as cables and RF switches, charge-coupled devices, surface acoustic wave devices, lumped-element delay lines, digital delay lines, digital RF memories, etc.

It is yet another object of the present invention to provide an ACT selectable delay line (SDL) device that is implemented in a very space-efficient manner and has very low dispersion and low signal distortion, relative to cables and RF switches.

It is another object of the present invention to provide an ACT selectable delay line (SDL) device that is well-suited for use in radar, electronic warfare, and communications systems, which require variable delays of wideband signals.

It is still another object of the present invention to provide an ACT selectable delay line (SDL) device that provides digitally controlled sampling analog delay for wideband signals.

It is a further object of the present invention to provide an ACT selectable delay line (SDL) that is based on the gallium-arsenide technology of acoustic charge transport, thereby providing a that is solid state and is compact and easy to use.

It is yet another object of the present invention to provide a self-oscillating, SAW generating system for the ACT device whose optimal frequency of operation is maintained by elements integrated on the same IC chip as the ACT device.

The selectable delay line (SDL) device according to the present invention is made up of the following essential elements:

a) An acoustic charge transport (ACT) tapped delay line consisting of a transport channel illuminated by a SAW beam, means for injecting electronic charge into the channel, and means for repeatedly and non-destructively sensing the charge in the channel as it is transported by the acoustic beam. The injector means used in the preferred embodiment is a multiple injector architecture implemented using island injectors as described herein. The means for non-destructively sensing the charge is a series of non-destructive sense (NDS) taps (electrodes) placed along the transport channel.

b) Means for monolithically switching the RF signal from each of the NDS taps so that the tap signals are either connected to the output bus of the device ("on") or shunted to the ground ("off"). The switching means used in the preferred embodiment is a double isolation diode switching circuit fabricated on the same Gas substrate as the ACT tapped delay line. The ability to achieve monolithic integration of the RF switch circuitry results in improved "on/off" ratio, improved signal-to-noise ratio, reduced insertion loss, improved tap uniformity, and reduced tap-to-tap coupling as compared to hybrid implementations. The performance of this switching means is of paramount importance in determining the utility of the selectable delay line. The monolithic structure is also more manufacturable and repeatable than hybrid implementations because component non-uniformities as well as parasitic conductances and capacitances are drastically reduced. The tap selection determines the delay setting of the device. The tap selection is accomplished utilizing a combination of tap addressing logic and RF switching circuitry. These circuits are implemented partially on the ACT device and partially in supporting hybrid circuitry and the tap selection is determined by an externally-supplied digital word.

c) Means for detecting and amplifying the signal present on the output bus of the device and connecting it to the output module. The detection/amplification means in the preferred embodiment is a two stage hybrid amplifier utilizing a SAW notch filter between the stages to prevent saturation of the second stage. The SAW trap prevents saturation of the detection amplifier.

d) Means for generating the single frequency, large-amplitude surface acoustic wave which is required for operating the ACT tapped delay line. The SAW generating means used in the preferred embodiment is the Phase Tracking SAW Drive Oscillator made up of a SAW delay line (input and output transducers) on the ACT chip and a hybrid feedback/drive amplifier which supplies the high-power (~1 watt) drive signal.

The novel features of the SDL device are the use of an ACT tapped delay line to provide time-delayed replicas of the input signal in combination with means to select and provide one of many tap signals to the output and the inclusion of a self-oscillating acoustic system to make the SDL device a self-contained signal processing module requiring only DC power, a digital tap selection word, and an RF input signal.

The phase tracking SAW drive oscillator in accordance with the present invention for ACT devices is made up of the following essential elements:

a) A SAW delay line (made up of input and output transducers) with the proper phase response (i.e., specific delay).

b) An amplifier with proper gain and output power used to drive the input transducer with the optimal single frequency, large amplitude ($\approx 1$ watt) surface acoustic wave which is required for ACT delay line operation.

c) An ACT channel on the same IC substrate.

SAW delay line oscillators are used as a frequency source to provide a stable output frequency with high spectral purity. In order to do this they require special types of substrate material which have minimal SAW velocity propagation variations with temperature. In the case of quartz substrates, this occurs at a specific temperature so a thermal control system is required which not only holds the substrate temperature extremely constant, but does this at a specific substrate related temperature.

The phase tracking SAW drive oscillator does not require a specific absolute frequency of operation and its purpose is not to provide an external frequency output (although it could be made available by tapping power from the circuit or using an extra diagnostic pick-up transducer), but needs to only generate SAW of sufficient magnitude ($\approx 1$ watt) and at the proper frequency for optimal ACT device operation. This is accomplished by using a SAW system with the same periodicities as the ACT device and maintaining the proper frequency of operation in a feedback phase tracking oscillator configuration.

The fundamental components of a multiple injector ACT architecture in accordance with the present invention are:

a) A main ACT transport channel illuminated by a SAW beam.

b) Two or more ACT subchannels illuminated by the same SAW beam which terminate in (with respect to SAW propagation) the main ACT transport channel such that their individual charge signals are combined.

c) ACT charge injection structures in each ACT subchannel for injecting signal charge which is acoustically transported from each subchannel to the main channel.

The critical elements of an ACT island charge injection structure used in accordance with the present invention are:

a) An ACT channel illuminated by a SAW beam.

b) One or more barriers to acoustic charge transport situated within the channel.

c) An ohmic contact aligned with and preceding (with respect to SAW propagation) each barrier.

d) A control gate disposed around each ohmic contact to control electron injection in a direction transverse to the SAW propagation direction.

These and other objects of the present invention will become apparent from the following detailed description.

BRIEF DESCRIPTIONS OF THE DRAWINGS

FIG. 1 shows an acoustic charge transport (ACT) device.

FIG. 2 is a functional schematic diagram of a solid state tapped ACT selectable delay line (SDL) device with on-chip selection circuitry in accordance with the present invention.

FIG. 3 is a trace of a typical RF pulse response output from three of the taps of the device of FIG. 2.

FIG. 4 shows a typical frequency response of the ACT SDL device of FIG. 2.

FIG. 6 is a schematic diagram of an on-chip tap address circuitry, shown with a plurality of diode-logic decoders for one tap, used in the device of FIG. 5 in accordance with the present invention.

FIG. 7 is a schematic diagram of an on-chip tap RF tap switching circuit for a single NDS tap used in the device of FIG. 5 in accordance with the present invention.

FIG. 8 is a schematic diagram a RF output interface circuit used in the device of FIG. 5 in accordance with the present invention.

FIG. 9 is schematic diagram of an alternative configuration for the tap RF switches of the device of FIG. 5.

FIG. 10 is a functional block diagram of a SAW delay line oscillator used in the device of FIG. 5 in accordance with the present invention.

FIG. 11 is a block diagram of two alternative embodiments of the oscillator shown in FIG. 10.

FIG. 12 is a top view of a multiple injection architecture implemented with the standard transchannel contact injector used in the device of FIG. 5 in accordance with the present invention.

FIG. 13 is an enlarged view of a single island injector in a single channel used in the device of FIG. 5 in accordance with the present invention.

FIG. 14 is a top plan view of a multiple island injectors of FIG. 13 in an application to an ACT channel of relatively large width greater than roughly 40 microns.

DETAILED DESCRIPTION OF THE INVENTION

Figure 5:
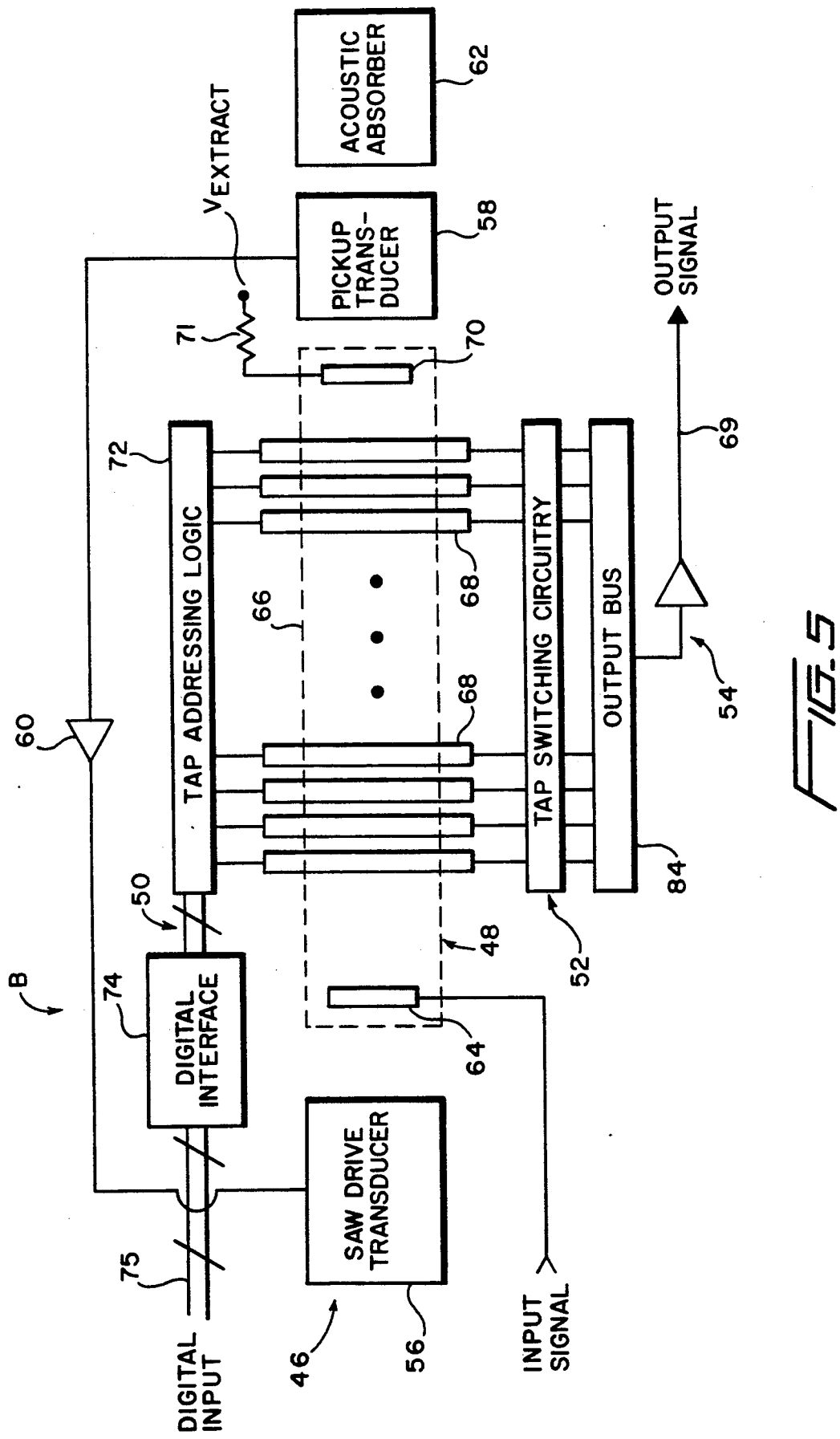
FIG. 5 is a functional block diagram of an ACT SDL device in accordance with the present invention.

The present invention is a semiconductor device along with supporting circuitry and analog electrical input Signals and delays them for a user-selected interval. The user specifies the desired delay by applying a set of digital signals to a programming port, and the delayed signal is provided as an analog electrical output signal.

The selectable delay line (SDL) function can be thought of as a subset of the programmable transversal filter function. The SDL can have any one (but only one) of its taps set to a weight of 1 (the "on" state) and all others are set to zero (the "off" state). It can provide one delayed replica of the input signal at a delay chosen from the possible settings which are determined by the user and location of the taps.

FIG. 1

An acoustic charge transport device (ACT device) A, as best shown in FIG. 1, is described in U.S. Pat. No. 4,633,285, the disclosure of which is hereby incorporated by reference. The device A comprises an active piezoelectric semiconductor layer 10 mounted on substrate 12. The layer 10 is, preferably, comprised of gallium arsenide.

Transducer 14 is mounted to surface 16 of substrate 10. Source 18 provides an energizing signal to the negatively biased piezoelectric transducer 14, in order to cause generation of a high frequency surface acoustic wave which propagates through substrate 10. The transducer 14 generates a surface acoustic wave having a wavelength of approximately 7.9 microns over a beam width of 140 wavelengths at a source frequency of 367.1 MHz.

A plurality of aluminum Schottky barrier plates 20 are uniformly positioned on surface 16 of substrate 10. An input contact or like structure 22 is interposed between transducer 14 and the first of Schottky barrier plates 20, and is adapted for injecting charge representative of a signal into the underlying transport channel so that the charge is transported by the wave generated by transducer 14. An output contact or like structure 24 is provided at the opposite end of substrate 10 for extracting charge from the substrate 10 after it has been transported therethrough by the surface acoustic wave. Depletion of the channel electrons under the Schottky barriers 20 causes a transport channel to be defined in the substrate 10, and the surface acoustic wave generated by the transducer 14 causes charge injected through input contact 22 to be transported through the channel to output contact 24. Means may be provided around the transport channel for minimizing electrical interaction with adjacent structures and for further defining the transport channel. My prior patent, U.S. Pat. No. 4,633,285, issued Dec. 30, 1986, for ACOUSTIC CHARGE TRANSPORT DEVICE AND METHOD, the disclosure of which is incorporated herein by reference, utilizes guard rings around the device for this purpose, although like effects may be achieved through selective proton bombardment of substrate 10.

A plurality of non-destructive sense electrodes or taps 26 are disposed along surface 16 in uniformly spaced relation. Each of the non-destructive sense electrodes 26, is preferably, disposed between two adjacent barrier plates 20. The non-destructive sense electrodes 26 each have an output terminal 28 which is coupled through capacitor 30 to ground. The electrodes 26 are non-destructive because they do not interfere with or otherwise inhibit transport of the charge packets.

As noted in my earlier cited patent, charge injected into the transport channel through input contact 22 is transported through the channel with the surface acoustic wave generated by transducer 14. The charge is transported in the positive half cycles of the wave, and the charges are bunched by the wave in discrete identifiable packets. Movement of the charge packets through the channel causes an image change to be impressed upon each of the non-destructive sense electrodes 26 as the packets pass below. The image charges move with the associated charge packets, with the result that the non-destructive sense electrodes 26 sense the charge quantities of the packets as they move along the channel, and therefore, permit this quantity to be determined. The result is that the non-destructive sense electrodes 26 each provides an output at the associated terminal 28 which is representative of the charge being transported by the surface acoustic wave at the point in time and at the location in the channel.

FIGS. 2, 3 AND 4

Referring to FIG. 2, an ACT selectable delay line (SDL) device B is a solid state tapped delay line with on-chip tap selection circuitry 32. An analog input signal 34 is converted to a series of electron packets which are transported in the travelling potential wells of a surface acoustic wave (SAW). The formation of the packets may be thought of as a sampler 35 operating at the frequency of the SAW drive oscillator 37, which is 370 MHz for the device B. The signal samples (charge packets) are nondestructively sensed by a series of electrodes 36 which serve as the taps on the delay line. Different delays are achieved by connecting the appropriate sensing tap 36 to an output bus 38 through onboard RF switches 40. The delay step size is set by the spacing of the electrodes 36; the maximum delay is determined by the location of the last tap. An output interface amplifier 42, digital interface circuitry, and the SAW drive oscillator are also contained within the device module. Delay select input of n bits is fed into an address decoder 44 that acts on the delay select input to select the appropriate tap 36 that is decided to be turned on. The selected tap 36 then routes input signal 34 through the amplifier 42 to generate an analog output signal.

FIGS. 3 and 4 show a typical RF pulse response and a typical frequency response of the device B, respectively.

FIG. 5

A more detailed block diagram of the SDL device B is shown in FIG. 5. The device B is made up of five major elements: an acoustic system 46, an ACT tapped delay line 48, a tap selection circuitry 50, a tap RF switching circuitry 52, and an output interface circuit 54.

The acoustic system 46 consists of a surface acoustic wave (SAW) delay line made up of an input (drive) transducer 56 which generates a surface acoustic wave, an output (pick up) transducer 58, which senses the surface acoustic wave signal at the end of the ACT chip, and a feedback (SAW drive) amplifier 60, which amplifies the sensed signal and feeds it back to the input transducer 56 to form an oscillator. This architecture is known as a delay line oscillator (DLO) and it provides a single-frequency SAW at a power level determined by the characteristics of the feedback amplifier 60 (specifically its gain and saturation point). This configuration is attractive because no external signal source is required; only DC power is needed to operate the oscillator. The SAW energy which propagates past the pickup transducer 58 is absorbed in an acoustic absorber 62 located at the end of the chip.

The acoustic system in the present SDL device B operates at 370 MHz and thus the input signals applied to the device are sampled at this rate. This provides a Nyquist bandwidth of 185 MHz, of which approximately 150 MHz can be effectively used because of low-frequency noise (degraded signal-to-noise ratio below 20 MHz) and roll-off in the response of the device B above 170 Mhz. Future versions may operate at higher sampling rates and provide wider bandwidth delay capability.

The ACT SDL device B uses a relatively standard proton-isolated ACT channel architecture. The input signal is applied to an input contact 64 and the SAW forms a series of electron packets which represent a time-sampled version of the input signal. The SAW also transports these packets down the ACT channel 66. In the present SDL device B, up to 128 NDS electrodes 68 spaced by as little as 5 nanoseconds are included as signal taps, any one of which can be connected to the output port 69 to generate an output signal from the input signal. The SAW carries the charge packets under and past the NDS electrodes 68 and to the output contact 70 connected to a resistor 71. An extract voltage $V_{extract}$ is applied to the output contact 70 to remove the packets from the channel 66. The SDL device input 64 is made up of 12 so-called lateral injectors (a new and non-standard standard input contact design) and a compensation technique is used which causes the signal strength to increase with frequency. This is intended to compensate for frequency roll-off suffered in other parts of the delay line, such as in the NDS electrodes 68 and the RF switching network 52.

Tap selection is achieved via a hybrid circuit 50 consisting of an address logic circuitry 72 on the ACT device B itself and an off-chip digital interface circuit 74. The digital interface 74 accepts 7 TTL-level digital input lines 75. Digital input in the form of a 7-bit digital binary word that is input to the input lines 75 is provided by the user in order to select one of the taps 68 that is available on the SDL device B. These inputs are applied to 7 standard TTL inverters (not shown) which produce the complement for each control bit. The control signals and their complements are collectively referred to as the address bus. Both the signals and the complements are applied to level shifters (not shown). The level shifters give +2.5 volts for a logical '1' and −2.5 volts for a logical '0'. The resulting 14 level-shifted lines are applied to the ACT device B and are referred to as the address bus.

FIG. 6

The on-chip tap address circuitry 72 consists of 128 diode-logic decoders 76, as best shown in FIG. 6. A schematic of this circuit for one tap is shown. The address bus signals are applied to the diode array and produce a control current $I_{control}$ that sets the states of the RF switches which are connected to the other side of the NDS tap 68, thus determining which tap is on. When $I_{control}$ is positive the tap is "off"; when $I_{control}$ is negative the tap is "on". The diode array is made up of N diodes where 27 is the number of taps (e.g. 7 diodes for a 128 tap device). The address of the tap 68 is determined by the connection pattern of the diodes 76.

The anode of each diode 76 is connected either to one of the bits of the address word or to its complement. The choice of the connections for each bit sets the address of the tap 68. Each of the taps 68 is set to a different "code" so that no more than one tap can receive a negative control current, and thus be turned "on" at any given time. There is one diode 76 for each bit of the address word and all of the cathodes are connected to a common bus 78 (one for each tap) and then through resistor 80, approximately 40 kilohms, to the negative bias voltage, $V_{bias}$, which is approximately −5 volts. The other side of the bus 78 is connected through resistor 82, about 30 kilohms, to the individual NDS tap 68.

The address shown in FIG. 6 is 0000001 for tap No 1 digital signals $A_1, \overline{A}_1, \ldots \overline{A}_7$, are the seven input bits of the digital input as shown in FIG. 5 and their complements. Each of the digital signals $A_1$ through $A_7$ represents logic 0 and $\overline{A}_1$ through $\overline{A}_7$ represents logic 1.

FIG. 7

A schematic of the RF switching circuit 52 for a single NDS tap 68 is disclosed in FIG. 7. It is designed to connect one NDS tap 68 in the ACT channel 66 to the output bus 84 with a negligible attenuation when the control current $I_{control}$ is negative (the "on" state). If the control current $I_{control}$ is positive, the NDS tap signal is to be shorted to ground and provide the maximum isolation between the NDS tap 68 and the output bus 84 (the "off" state). The ratio of the "on" tap attenuation to the "off" tap isolation is called the on/off ratio. The switch circuit 52 is also designed to present a very high impedance to the output bus 84 when the tap 68 is off in order to keep parasitic losses down and avoid "loading" the bus 84. A DC bias control circuit, as best shown in FIG. 8, is used on the output bus 84 to hold it at roughly +0.75 volts and to source/sink the appropriate DC current. This allows proper operation of the RF switching circuitry 52.

The RF switch itself is a current-controlled double-isolation diode switch controlled by the SDL tap address section as described above. The tap 68 is attached to the anode of shunting diode 86 and the cathode of the series diode 88. The anode of the diode 88 is connected to the cathode of series diode 90 and the anode of another shunting diode 92. It is also connected to bias resistor 94 to $V_{bias}$. The anode of diode 90 from each tap 68 is connected to the output bus 84.

The RF switch is turned "on" when a negative control current $I_{control}$ is supplied by the address circuit. The negative current flows through diode 88 and reduces its impedance (for RF signals) significantly. Part of this current is shunted through resistor 94 and the rest flows through diode 90 to the output bus 84, thus reducing the impedance of diode 90. Diodes 86 and 92 remain reverse-biased and do not shunt the RF signal to ground. Since diodes 88 and 90 are both forward-biased, the NDS tap 68 is connected to the output bus 84 with a low impedance and the signal from this tap is thereby routed to the output.

The RF switch 52 is turned "off" when a positive control current $I_{control}$ is supplied by the address circuit. The positive current flows through diode 86 and reduces its RF impedance significantly. The current through resistor 94 follows through diode 92 and reduces its RF impedance as well. The diodes 88 and 90 have no current flow and their impedance is very high. The low impedance of diode 86 shunts the NDS signal to ground causing significant attenuation to the signal. The small remaining signal is coupled through the small capacitance of the reverse-biased diode 88. The forward-biased diode 92 further attenuates the signal by shunting it to ground a second time. The impedance of diodes 86 and 92 yield a very large overall signal attenuation and the result is an on/off ratio of approximately 60 dB for each tap 68.

FIG. 8

The output interface circuit 54, shown in FIG. 8, is connected to the output bus 84 and consists of a DC bias control circuit 96 and an RF output circuit 98.

The DC bias circuit 96 is an operational amplifier circuit 97 which holds the output bus solidly at +0.75 volts (set by the drop across diode 100) and provides a current path for the DC control current from the RF switch circuitry 52. A DC bias voltage (+5 volts) V for the diode 100 creates a reference voltage for the bias control circuit 96. The values of resistors 102 and 104 are high enough that they do not load down the output bus 84 which would attenuate the output signal. The operational amplifier circuit 97 does not respond to signals above 1 MHz and therefore no distortion of the 20 to 170 MHz output signal is observed.

The RF output circuit 98 is a two-stage amplifier with a notch filter ("trap"). The single tap 68 that is turned "on" supplies the RF signal on the output bus 84. The first stage amplifier 106 is AC-coupled to the output bus 84 and provides gain and impedance buffering so that the output is compatible with 50 ohm systems. Both the input capacitance of the first-stage amplifier 106 and its noise level are critical to overall RF performance of the SDL device B. The notch filter or "trap" 107 attenuates the SAW frequency signal emanating from the device and prevents it from saturating the second output stage. The second stage amplifier 108 is simply used to increase the output signal level so as to reduce the overall insertion loss (defined as the ratio of the input signal to the output signal) of the device B. The nominal midband insertion loss for the present device B is approximately 20 DB.

An output signal from the output circuit 98 is a delayed electrical output signal provided from the selectable delay line B.

VARIATIONS

The configuration described above is the single input, single connected tap, single output variation. This is the simplest architecture wherein a single input signal is accepted and a single delay replica is available at the output.

The single input, multiple connected-tap, single output variation involves the use of internal (on-chip) memory which allows more than one tap to be simultaneously connected to the output. There would still be only one output signal provided in this architecture, but it may contain multiple replicas (echoes) of the input signal. This function is useful in correlators, filters, simple radar signature generation, and digital frequency discriminators. This configuration is equivalent to a programmable transversal filter with one bit of tap weight control ("on" or "off" states).

A single input, multiple connected-tap, multiple output variation is identical to the previous version except that the individual taps are connected separately to different outputs instead of a common bus.

By utilizing multiple input signals in multiple ACT channels (each with a single connected-tap) and a common output bus, an architecture which is effectively multiple SDLs with the outputs connected together can be created. By putting the ACT channels on a single ACT chip, precise relative delays can be achieved. This architecture could be useful in phased-array antenna applications.

All variations of single or multiple inputs, single or multiple connected taps, or single or multiple outputs are possible, but the preceding are considered the most useful selections.

For the primary functional architecture considered in this disclosure, variations on each major sub-element of the device B are possible.

The diode-biased RF switch circuit in the preferred embodiment can be replaced with FET-based circuits. Future embodiments of the SDL device will almost certainly contain FETs as switch elements because of the recent development of an integrated ACT/FET fabrication process. The diode-based address logic could also be replaced with FET-based logic and achieve the same function.

The RF switches in the preferred embodiment are all tied to a common output bus. This architecture can be replaced by a binary tree configuration 52', as best shown in FIG. 9. This configuration reduces the output bus capacitance to that of a single switch, but increases the "on" resistance by a factor of 7 if one goes through 7 switches (as would be required in a 128-tap version). Using a combination of the single bus and the binary tree would be possible and might achieve an attractive compromise.

Many improvements in the ACT acoustic system are contemplated and could be incorporated in the SDL configuration. The present design uses a first-generation drive amplifier; two new versions are presently disclosed in FIGS. 10 and 11. The SAW beam in the present SDL ACT device uses one-eight wavelength (1 micron in this case) lines and spaces, but the same function can be realized using larger linewidths which improve the fabrication yield. No acoustic waveguides are utilized in the present device but ACT devices based on several types of waveguides have been implemented and showed improved performance in terms of the SAW propagation characteristics and the use of guides also allows a higher efficiency architecture in which nearly all the acoustic energy supplied to the device would be used to transport charge. The poor propagation characteristics of unguided SAW beams force significant additional power to be wasted on the chip since only the central portion of the beam can be used to transport charge. The location of the pick-up transducer at the end of the SDL device is not required. A recently-developed system, as disclosed in FIGS. 10 and 11, uses a pickup transducer between the transducer and the beginning of the ACT channel. This tends to simplify the layout of the circuit by eliminating a long connection from the end of the chip and also makes the acoustic system compatible with any length SDL (or other) ACT device. Lower power acoustic systems will be possible as output node capacitance is reduced and/or output amplifier sensitivity and noise characteristic are improved. Narrower ACT channels could then be implemented without sacrificing any dynamic range. An additional possible variation is a change in the SAW frequency which would increase or decrease the sampling rate (and thus the available Nyquist bandwidth) and would allow an increase or decrease in the input signal bandwidth/frequency range. Acoustic systems from 300 MHz to as high as 1 GHz are considered feasible, with the range from 360 MHz being the most practical.

Variations in the implementation of the SDL device B are also possible in terms of the number and spacing of the NDS taps, the SAW (sampling) frequency used, and the level of integration of the major elements. It is possible to implement SDLs with up to 2 microseconds of delay using a single ACT channel, and more than this if cascaded multi-channel ACT architectures become feasible. The tap spacing can be reduced from the 5 nanosecond value in the present design down to 1-2 nanoseconds in a single channel. This would imply that as many as 2000 taps are possible. While this is not technologically feasible at this time, it is possible to have many more than 128 taps in future designs. The SAW frequency of the SDL could be increased to as high as 1 GHz, but complete acoustic systems have not yet been developed over 400 MHz (although this is quite possible and likely). Lastly, it is conceivable that all of the functions shown in FIG. 5 could be integrated onto one GaAs ACT chip, yielding a complete SDL subsystem in an ultra-compact form.

The present SDL devices are not fully integrated in that not all of the circuitry is implemented on a single semiconductor substrate. However, the circuitry which is the most critical to the performance of the SDL, namely the RF switching circuitry, has been integrated onto the same GaAs substrate as the ACT tapped delay line. Future SDL embodiments are expected to move further in the direction of monolithic integration and a fully monolithic ACT selectable delay line is feasible.

The primary advantages of monolithic integration in the present SDL device are improved on/off ratio, reduced insertion loss, improved tap uniformity, and improved manufacturability. Each of these areas is addressed below.

Perhaps the most important performance parameter in determining the utility and quality of a selectable delay line of this type is the on/off ratio. The on/off ratio is defined as the ratio of the output signal due to a given tap when the RF switch is closed ("on") to the output signal due to the same tap when the switch is open ("off"). Low on/off ratios lead to substantial distortion of the output signal, especially in devices with a large number of switchable taps. The monolithic structure of the ACT SDL allows very high on/off ratios to be achieved (~60 dB) in a simple and easily repeated manner. If the same RF switching circuit used in the SDL was implemented in a hybrid (i.e. off-chip) architecture, similar to that of previous SAW-based approaches, the on/off ratio could be expected to degrade significantly. The connections (wire bonds and connecting traces) between the delay line chip and the off-chip switching circuitry give rise to parasitic capacitances and resistances which are not desirable. These parasitics create undesired conduction paths which shunt the RF switches (reducing their effectiveness in the "off" state) as well as increased series resistance (increasing the loss of the switch in the "on" state). The result is a lower on/off ratio.

Insertion loss (defined as the ratio of the input signal to the output signal) is another fundamental parameter for the SDL. The total capacitance of the output sensing node must be kept small if reasonable insertion loss is to be maintained. Once again, if the present SDL were implemented with a hybrid RF switching circuit, the added capacitance of each switch (caused by the connections) would increase the node capacitance. Assuming no change was made in the output amplifier, this would "load" the output bus and reduce the signal generated by a given tap and increase insertion loss. The signal/noise ratio observed at the output of the SDL would also degrade because the noise level is determined by the noise generated by the output amplifier and remains constant while the output signal level would reduce.

The tap-to-tap uniformity of the SDL is also affected by the monolithic integration. The same parasitic impedances which cause decreased on/off ratio and increased insertion loss will contribute to non-uniformity in the tap outputs. This is because the hybrid configuration is susceptible to variations in bond wire length and variations in the switch elements (diodes or FETs). The parasitic impedances and non-uniformities of the switch elements are much more tightly controlled in a monolithic implementation and yield much higher uniformity.

The manufacturability of the monolithic switching configuration is much higher than hybrid configurations. The performance parameters discussed above are improved generally by monolithic integration, and repeatability and efficiency of manufacture are also enhanced. A full monolithic SDL (i.e. an "SDL on a chip") represents the ultimate in manufacturability since all of the circuitry would be fabricated using more controlled monolithic techniques. Even the present version of the SDL is more manufacturable than other approaches because of the RF switching circuitry, which largely determines performance, has been integrated and is therefore both higher in performance, and more repeatable. The monolithic integration of the SDL, whether partial or total, therefore results in higher fabrication yields and lower cost than an equivalent hybrid approach.

It is the ability to monolithically integrate RF switching and other circuitry with the ACT tapped delay line which allows the ACT SDL to be achieved. The well-known advantages of the ACT delay line (wide bandwidth, low dispersion, and the truly non-destructive sensing capability) coupled with the advantages of monolithic RF circuitry described above constitute a unique and significant advancement in selectable delay lines over the prior art.

FIG. 10

For ACT SDL device B, comprised of a SAW system and an ACT structure, its optimal frequency of operation varies with temperature. For a SAW system operating near 370 MHz, a change in frequency of 1.5 MHz can result in a temperature shift of only 80 degrees C. However, the bandwidth of the SAW system may only be a few hundred kHz. In addition, the ACT device structure is fabricated with the same mechanical periodicities as the SAW system and shares the same optimal frequency of operation. As a result, it is difficult to obtain optimal ACT performance by generating the SAW with a fixed frequency RF generator unless a means of stabilizing the device temperature is used. A phase tracking SAW drive oscillator, in accordance with the present invention, uses one or more SAW sensing transducer to dynamically maintain the optimal frequency of oscillation in a closed-loop feedback system.

A block diagram of a phase tracking SAW drive oscillator 110 is disclosed in FIG. 10. It consists of a SAW substrate 112 upon which is fabricated an ACT channel 114 for ACT device operations, a unidirectional drive transducer (UDT) 116 for generating high power SAW (consisting of an interdigital SAW drive transducer 118 with a properly phased reflector 120, and an output sensing (pick-up) transducer 122 for extracting a small portion of the SAW generated by the UDT. An amplifier 124 provides a feedback function by having its input connected to the pick-up transducer 122 and its output connected to the transducer 118 to form an oscillator. This architecture is known as a delay line oscillator (DLO) and it provides a single frequency SAW at a power level determined by the characteristics of the amplifier. A SAW absorber 126 is placed at the end of the substrate 112 to dissipate all remaining propagated SAW energy.

The two fundamental conditions for the circuit to initiate oscillation are:

a) the electrical phase change associated with the amplifier 124 and the SAW delay line is an integer multiple of $2\pi$ radians or $$O_A + O_D = 2n\pi \quad n = 1, 2, 3 \ldots$$

where $O_A$ and $O_D$ are the phases of the amplifier 124 and the delay line, respectively; and b) the small signal gain of the amplifier 124 at the frequency of oscillation is greater than the loss associated with the delay line and any other associated loop components.

The phase determines the frequencies of oscillation (condition (a)) while the frequency response of the SAW system is designed to suppress oscillation at all but one of the possible oscillation frequencies (condition (b)).

In this circuit, the correct loop phase is obtained with the proper placement of the pickup transducer 22 in the axis of SAW propagation. The specific frequency of operation is set by the narrowband nature of the UDT. Physically, the frequency is determined by the ratio of the velocity of SAW propagation to the wavelength of the SAW signal which is governed by the periodicities within the SAW transducers. This periodicity matches those of the features in the ACT channel so that both the SAW and ACT systems operate optimally at the same frequency.

The amplifier's output power capability is selected to provide sufficient SAW power for acceptable ACT device performance. The loop gain of the system can be adjusted by changing the gain of the amplifier 124 and/or the size of the pick up transducer 122. The pick up transducer 122 will extract a small portion of the SAW. If it is placed before the ACT channel 114, it should extract the minimum amount of power so as to not adversely affect ACT device performance. If the proper conditions for oscillation are present at circuit start up, the amplitude of the SAW signal will build until the amplifier's output power and gain stabilize due to its saturation characteristics (i.e., the output power increases until the amplifier's gain drops due to gain compression and the oscillator's loop gain drops to a value of one). Generated SAW having passed the pick-up transducer 122 and the ACT channel 114 is no longer required and its energy is dissipated in the SAW absorber 126 in the form of heat.

Once the circuit is oscillating, the substrate 112 may experience changes in temperature due to heating by the circuitry on the IC or changes in ambient temperature. Changes in temperature will alter both the velocity of SAW propagation and the physical periodicities in the SAW transducers 118 and 122 (due to thermal expansion or contraction) changing the phase $O_D$ of the delayed SAW signal. The frequency of the oscillator system must then change to maintain the zero loop phase necessary for continued oscillation (condition (a)). The phase change of the amplifier 124 with this necessary frequency change should be small compared to the phase change of the delayed SAW signal. In essence, the oscillator system provides a phase tracking or compensating function in order to maintain a frequency of operation consistent with the periodicities of the features on the SAW substrate 112. The forcing of the phase of the delayed SAW signal also causes a constant number of SAW wavelengths to be spatially maintained between the centers of SAW generation in the UDT and the center of signal extraction in the pick-up transducer 122. If the pick-up transducer 122 is placed in exactly the right spot, the constant number of wavelengths becomes an integral value.

FIG. 11

FIG. 11 discloses other embodiments of oscillators 127 that are similar to the oscillator 110 discussed above. The oscillator 127 are similar to the oscillator 110 except for the addition of a phase shifter 128 and another pick-up transducer 130. The phase shifter 128 can be used to adjust the loop phase instead of physically altering the placement of the pick-up transducer (UDT) 118.

The oscillator 127 has been demonstrated with the pick-up transducer 122 between the UDT 118 and the beginning of the ACT channel 114 as well as between the end of the ACT channel 114 and the acoustic absorber 126, as best shown in FIG. 11. A pick-up transducer could also conceivably be placed within the ACT channel 114, or a feature of the ACT channel could be used as a SAW transducer, but no immediate benefits of doing this come to mind. Another possible configuration is to have pick-up transducers 122 and 130 before and after the ACT channel 114 with their outputs bused together behaving effectively as a spatially larger single pick-up transducer.

The oscillator 127 used a single pick-up transducer 130 between the end of the ACT channel 114 and the acoustic absorber 126. SAW power extracted at this point on the substrate 112 will not diminish ACT device performance, but it does require a long connection from the end of the chip to the amplifier 124. This connection must pass the input/output connections of the ACT channel and could affect ACT device operation or be affected by it and makes the physical layout of packaging more complex. Having the UDT 118 and the pick-up transducer 130 spaced apart does produce an oscillator with a higher effective Q (i.e., frequency coherence). However if it is placed too far away, or if the SAW system is designed to operate at a higher frequency, the phase of the delayed SAW signal may repeat itself multiple times within the bandwidth of the SAW system. This can result in a problem known as moding where one or more frequencies of oscillation may occur individually or even simultaneously.

The oscillator 127 has also been demonstrated using a pick-up transducer 122 between the UDT 118 and the ACT channel 114. This configuration makes the same circuit design and SAW system compatible with any length SDL (or other) ACT device. This configuration does extract a small amount of SAW power which would be used in the ACT channel 114 to transport charge (on the order of a few percent) but it does simplify physical layout as well as allowing operation at much higher frequencies without the possibility of moding.

Another configuration is busing the outputs of multiple pick-up transducers 122 and 130 together, as best shown in FIG. 11. If the two bused transducers are placed a specific number of wavelengths apart, the output response of the resulting bused transducers is a maximum when that number of SAW wavelengths is present on the substrate 112 between the centers of the two individual transducers 122 and 130. The bandwidth of this resulting response is much narrower than that of either of the individual transducers 122 and 130 and becomes narrower as the spacing between the transducers is increased. If this spacing is made to be an integral number of wavelengths and the transducers 122 and 130 are placed before and after the ACT channel 114, the number of wavelengths in the channel at any instant of time are constrained to be an integral number of wavelengths. This allows a very tight correspondence between the periodicities of the physical structures in the ACT channel 114 and the wavelength of the propagating SAW. This feature would especially benefit applications such as SDL's with multiple taps (or any ACT based spatial filter) as well as ACT analog memory devices.

The amplifier function has been realized in several different ways. It has been composed of commercially available power amplifiers and specifically designed hybrid circuits. One such hybrid circuit consisted of a Si bipolar based power amplifier with appropriate input and output matching networks, one or two commercially available Si bipolar based gain blocks, and phase shifters made up of lumped components or different lengths of microstrip delay lines. The other type of hybrid amplifier consisted of simply a GaAs power FET with input and output matching networks. The small size of the single GaAs FET amplifier circuit indicates that the amplifier could be integrated on the same IC chip with the SAW system and the ACT device channel, resulting in complete SDL (or other ACT) mechanism on a single IC substrate.

Other improvements can be implemented for the SDL acoustic system. The SAW transducer features in the present ACT SDL device uses one-eight wavelength (1 micron in this case) lines and spaces, but the same function can be realized (and has been demonstrated) using larger line widths which improve the fabrication yield. No acoustic waveguides are utilized in the present device, but ACT devices based on several types of waveguides have been implemented (and demonstrated with the single FET amplifier circuit) and show proved performance in terms of the SAW propagation characteristics. The use of guides also allows a higher efficiency architecture in which nearly all the acoustic energy supplied to the device would be used to transport charge. The poor propagation characteristics of unguided SAW beams force significant additional power to be wasted on the chip since only the central portion of the beam can be used to transport charge. Lower power acoustic systems will be possible as output node capacitance is reduced and/or output amplifier sensitivity and noise characteristic in the ACT device are improved. Narrower ACT channels could then be implemented without sacrificing any dynamic range. An additional possible variation is a change in the SAW frequency which would increase or decrease the sampling rate (and thus the available Nyquist bandwidth) and would allow an increase or decrease in the input signal bandwidth/frequency range. Acoustic systems from 300 MHz to as high as 1 GHz are considered feasible, with the range from 360 MHz to 700 MHz being the most practical.

FIG. 12

The structure and operation of a charge injection architecture used in the SDL device B will now be described. FIG. 12 discloses a top view of the fundamental features of the multiple injection architecture implemented with the standard transchannel contact injector. A proton isolation boundary 132 defines the region outside of which is bombarded by high energy protons during the fabrication process to render the ACT epitaxial layer electrically insulating. The interior of the region defined by this boundary 132 is the active channel region. The proton isolation is used to define the transport channel 133 and two or more injection subchannels 133, 135 and 137 (illustrated with 3 subchannels) in which ohmic contacts 134, 136 and 138 for charge injection and Schottky barrier metal injection control gates 140, 142 and 144 are placed to realize independent injection structures. The delay between the injectors is established by their position along the direction of SAW propagation while the injection strength of each injector is determined by the width (in the direction perpendicular to the SAW propagation direction) of the ohmic contact.

The remainder of the epitaxial layer surface is covered by one or more Schottky barrier metal channel plates 146, 148 and 150 to provide depletion of the epitaxial layer as described in the prior art. The channel plate 152 is used schematically to also represent the variety of "channel at large" structures which can be used in general in different ACT devices such as the NDS array in transversal filters, selectable tap structure in SDL, etc. The details of the device structure beyond this feature are the same as described previously for ACT device B.

The ohmic contact and control gate of each injector is interconnected to one of four electrical buses 154, 156, 158 and 160 depending on whether the injector is intended to be operated in the inverting or non-inverting injection mode. Inverting mode operation provides a 180 degree phase shift for injection which permits the implementation of negative impulse response weights. The input signal is routed to the ohmic contact for non-inverting mode (while the corresponding gate is bypassed to ground) or routed to the control gate for inverting mode (while the corresponding ohmic contact is bypassed to ground). Bus 154 is used for non-inverting mode injector gate connections. Bus 156 is used for non-inverting mode injector ohmic contact connections. Bus 158 is used for inverting mode injector gate connections while bus 160 is used for inverting mode ohmic contact connections. In general each of these buses receives DC bias through resistors 162, 164 and 166 and the input signal or signal bypassing to ground through capacitors 168, 170 and 172. FIG. 12 shows the interconnections which produce non-inverting operation in the center subchannel and inverting operation in the outer subchannels. In the configuration shown, the non-inverting injector (center subchannel) is operated with its control gate at DC ground and hence a DC bias resistor or control gate bypass capacitor is not needed.

In operation, input AC signal is applied to terminals 174 and 176 while maintaining appropriate DC bias on terminals 178, 180 and 182. Typically, a positive voltage is applied for DC bias of the ohmic contacts (terminals 178 and 182) while ground or a negative DC voltage is applied to the control gates (terminal 180 and bus 154). The actual voltages required depend primarily on the epitaxial material depletion voltages. Current sources may also be used to drive fixed DC current levels into the ohmic contacts to establish the desired quiescent currents in the subchannels.

In both the non-inverting and inverting mode connected injectors, electron injection takes place through the ohmic contacts 134, 136 and 138. AC modulation of the injected charge is accomplished in the non-inverting mode injector by applying the input signal directly to the contact; in the inserting mode injectors, AC injection modulation is accomplished by applying the input signal to the control gate to induce electric fields near the contact which inhibit or enhance the contact injection. Hence, a negative voltage on the control gate tends to inhibit the electron injection through the contact providing a means for achieving the 180 degree phase reversal between injected current and applied voltage.

The SAW uniformly illuminates all the subchannels as well as the main transport channel. The injected charge packets in each of the subchannels 133, 135 and 137 are transported by the SAW via the acoustic charge transport effect to the main transport channel 131 where the absence of the subchannel defining proton isolation boundaries permits the continuous trains of subchannel packets to combine into one uniform train of transport packets representing the sum of the individually injected signals. This superposition results in an effective composite injection impulse response consisting of N elements where N is the number of subchannels. The polarity, strength, and time position of the impulse response elements are determined by the polarity (non-inverting or inverting), width, and position of the subchannel injectors respectively. In the SDL, the outer inverting subchannel injectors have equal widths which are roughly $\frac{1}{4}$ the width of the center non-inverting injector and they are spaced forward and behind (with respect to the SAW propagation direction) from the non-inverting center injector by one SAW wavelength. This creates an impulse response in time consisting of 3 elements spaced by one SAW period apart, with element polarities and weights to provide an injection response which increases in magnitude with increasing frequency in such a way as to compensate the single NDS electrode frequency response perturbation. In general, arbitrary impulse responses and corresponding frequency responses can be created in this manner.

This structure differs from the typical ACT charge injector used in previous ACT devices. The ACT channel isolation pattern and injection structures are configured into two or more subchannels for injection purposes to permit multiple, electrically independent charge injections to be distributed across the ACT channel and ultimately superposed (combined) into one transport channel. This multiple charge injector isolation architecture is used specifically for the purpose of achieving two or more simultaneous charge injections with independent injection polarities, signal strengths, and time delays. The superposition of these injection signals into one common channel permits the realization of an input charge injection impulse response which is distributed in time and which has specific desired frequency response characteristics. Therefore, this injection architecture performs a transversal filter function (like ACT output nondestructive sensing electrode arrays) which is used to tailor the charge injection frequency response. This type of input architecture is particularly useful in the SDL because this device is configured to provide a selectable delay from only one NDS electrode tap at a time, hence frequency response compensation using the transversal filtering function achieved by combining the outputs from many NDS taps is not possible.

Frequency response tailoring is desirable in ACT delay lines which optimally have uniform frequency response (the ideal delay line introduces signal delay with minimum amplitude frequency response variation) because a fundamental, unavoidable frequency response perturbation is always associated with the basic nondestructive sensing response of each NDS electrode. This response perturbation, primarily caused by the combined effects of the NDS electrode geometry (length), and the nonzero separation between the charge packet in the channel and the electrode at the surface, results in a slight loss of sensing time resolution which equivalently can be described as a nondestructive sensing detection sensitivity which gets weaker with increasing frequency. Hence, it is desirable to intentionally introduce an additional frequency response mechanism, either at the input or the output, with an amplitude characteristic which increases with frequency to counteract or compensate the basic NDS response. The multiple charge injection isolation architecture used in the SDL is designed to provide an input charge injection frequency response which compensates the NDS electrode response to provide improved frequency response uniformity for the entire device.

In general, the transversal filtering capability rendered by the multiple charge injection structure can also be used to construct ACT filters based on input filtering only, or both input filtering and output (NDS) filtering. Its utility is therefore much broader than the specific application to NDS response compensation described for the SDL.

The multiple injection architecture can be implemented using either the prior art transchannel contact injector or the island injector disclosed in FIG. 13 below.

FIG. 13

An alternative type of injector is used in the SDL device B. This charge injection structure, given the name Island Injector, is configured to provide charge injection in a direction transverse to the direction of SAW propagation (and hence charge transport) while still permitting relatively uniform injection across the width of the transport channel and good injection spatial resolution. Injection in wide channels is accomplished by distributing many island injectors across the channel width. This injector provides higher transconductance (defined as the ratio of injected signal current to applied signal voltage) than the prior art transchannel contact injector (which injects in the direction of SAW propagation) used in previous ACT devices. The higher transconductance results in a lower insertion loss than would be obtained with the prior art transchannel contact injector.

In general, the island injector can be used in both the multiple injection architecture or the simple single injector architecture.

The structure of a single island injector in a single channel is shown in FIG. 13. Proton isolation boundary 184 defines an ACT channel 186 while proton isolation boundary 188 defines an electrically insulating island 189 behind which a small ohmic contact 190 is situated in order to force charge injection through the contact only in the transversal (to SAW propagation) direction. A control gate 192 constructed from Schottky barrier metal is situated in close proximity to the ohmic contact such that injection in both directions perpendicular to the SAW propagation direction may be controlled. A channel plate 194 constructed from Schottky barrier metal is situated in close proximity to the control gate to provide depletion of the ACT channel 186 underneath the channel plate. The ohmic contact 192 receives DC bias and AC input signal through bias resistor 196 and capacitor 198, respectively, while the control gate 192 receives DC bias and AC signal through resistor 200 and capacitor 202, respectively. The entire ACT channel 186 and injection structure are illuminated by SAW. This structure embodiment is appropriate for achieving charge injection in ACT channels (or subchannels) with relatively narrow width of the order of a few tens of microns. Since it takes a finite time for injected charge to spread out across the channel width via diffusion and electrostatic debunching effects, there is an increasing injection response time associated with injection in increasing width channels. Hence, maximum injection speed is obtained when injection is limited across a narrow channel.

The exact shape of the insulating island 189 near the ohmic contact 190 is not critical. The primary criteria is that it be long enough in the direction of SAW propagation to significantly inhibit electron conduction processes through itself in this direction. The width of the island 189 should be large enough that the control gates 192 on each side of the ohmic contact 190 are subtended by the island; the island 189 must be wider than the spacing between the outer edges of the control gates 190, as best shown in FIG. 13. The island shape shown in FIG. 13 is designed to force transverse injection while permitting the injected packet to spread out across the whole channel width in front of the island as soon as possible during transit.

The island injector (or parallel composite of island injectors) is operated in a manner similar to the prior art transchannel contact injector. Typically, a positive DC bias voltage is applied to the contact through the bias terminal 212 while ground or a negative DC voltage is applied to the control gate through terminal 214. Non-inverting mode operation is achieved by driving the ohmic contact 190 with the AC signal through terminal 216 while bypassing the control gate 192 to ground through terminal 218. Inverting operation is achieved by driving the control gate 192 with the AC input signal through terminal 218 while the contact 190 is bypassed to ground through terminal 216. In either case, electron injection occurs through the ohmic contact 190 and the presence of the insulating island 189 forces this injection into the potential wells of the SAW via a transverse charge spreading effect. After the SAW has transported the injected packets past the island 189, the packet charge spreads out uniformly across the entire width of the channel 186. The transverse injection effect results in a higher injector transconductance than can be achieved with the transchannel contact injector because the electric fields of the SAW in the direction of propagation do not dominate the injection process as they do in the conventional transchannel contact injector. A drawback to the island injector is that the charge capacity of the injector is reduced compared to the transchannel contact injector since injection takes place over some fraction of the transport channel width due to the presence of the insulating island. It is therefore desirable to minimize the island width to maximize the effective injection channel width.

FIG. 14

FIG. 14 discloses an application of the island injector to ACT channels of relatively large widths greater than roughly 40 microns. The individual island injector structure is repeated several times across the channel width and the ohmic contact and control gate connections are bused in parallel via interconnects 204, 206, 208 and 210, respectively. DC bias and AC signal coupling elements are allocated to the parallel composite of island injectors. The transverse spacing (with respect to SAW propagation) of the injectors is established to achieve the required injection speed as described above. For example, injection speeds sufficient for injection of signals up to 180 MHz with minimum amplitude nonuniformity are typically obtained for spacings of 40 microns or less.

In a multiple injector architecture using island injectors, typically the subchannels of the structure will be sufficiently wide to require the composite island injector configuration shown in FIG. 14 for each subchannel. If the following criteria are met:

a) the island injectors are identical and the center to center spacing is held constant for all subchannels; and b) the spacing between the island injector centers and the subchannel proton isolation boundary for boundary adjacent injectors is equal to ½ of the injector center to center separation; then, the injection strength of each subchannel is proportional to the number of injectors in the subchannel. Equivalently, under these symmetric conditions, the injection strength of each subchannel is proportional to its width as (is obtained with The SDL device B as shown in FIGS. 2 and 5 utilizes the multiple injector architecture shown in FIG. 12 implemented with composite island injector structures like that shown in FIG. 13 for each of the 3 subchannels.

While this invention has been described as having preferred design, it is understood that the invention is capable of further modification, uses and/or adaptations following in general the principle of the invention and including such departures from the present disclosure as come within known or customary practice in the art to which the invention pertains, and as may be applied to the essential features set forth and fall within the scope of the invention or the limits of the appended claims.

I claim:

1. A delay device, comprising:
   a) a semi-conductor chip;
   b) an acoustic charge transport channel disposed on said chip and having first and second opposite ends and a longitudinal axis;
   c) means disposed at said first end of said channel for injecting an electronic signal into said channel;
   d) means coupled to said channel for generating a single frequency, large amplitude surface acoustic wave through said channel along a propagation direction from said first end to said second end for thereby transporting the electronic signal through said channel;
   e) a plurality of means operable associated with said channel end disposed along the propagation direction of the surface acoustic wave for non-destructively sensing the electronic signal as the electronic signal is transported by the surface acoustic wave;
   f) means monolithically disposed on said chip and operably connected to said sensing means for preselecting any one of said sensing means, thereby extracting a delayed replica of the signal from said channel;
   g) means operably connected to said preselecting means for processing the extracted delayed replica of the signal for generating an output; and
   h) said generating means comprising a delay line oscillator operably coupled to said channel.

2. A device as in claim 1, wherein:
   a) said processing means includes an output amplifier operable connected to said preselecting means.

3. A device as in claim 2, wherein:
   a) said processing means includes an output bus connected to said preselecting means, said output bus being at a predetermined voltage level; and
   b) a bias circuit operably connected to said output bus for maintaining said predetermined voltage level.

4. A device as in claim 1, wherein said delay line oscillator comprises:
   a) a drive transducer operably associated with said first end of said channel for generating the surface acoustic wave;
   b) at least one pick-up transducer operably associated with said channel for picking up the generated wave; and
   c) an amplifier having output and input connected to said drive transducer and said at least one pick-up transducer, respectively.

5. A device as in claim 4, wherein:
   a) said at least one pick-up transducer is disposed at said second end of said channel.

6. A device as in claim 4, wherein:
   a) said at least one pick-up transducer is disposed at said first end of said channel.

7. A device as in claim 4, wherein:
   a) said at least one pick-up transducer comprises first and second pick-up transducers;
   b) said first pick-up transducer is disposed at said first end of said channel;
   c) said second pick-up transducer is disposed at said second end of said channel; and
   d) said first and second pick-up transducers are connected to said amplifier input.

8. A device as in claim 4, wherein said generating means further comprises:
   a) a reflector coupled to said channel and disposed ahead of said drive transducer relative to the propagation direction of the surface acoustic wave.

9. A device as in claim 8, wherein said generating means further comprises:
   a) an absorber disposed at said second end of said channel.

10. A device as in claim 4, wherein said delay line oscillator further comprises:
    a) phase shifter connected between said amplifier input and said at least one pick-up transducer.

11. A device as in claim 1, wherein said injecting means comprises:
    a) an ohmic contact operable associated with said channel for injecting the electronic signal to said channel; and
    b) a Schottky barrier gate disposed adjacent and electrically coupled to said ohmic contact for controlling the injection of the electronic signal by said ohmic contact.

12. A device as in claim 11, wherein:
    a) said ohmic contact is disposed parallel to said longitudinal axis of said channel;
    b) said Schottky barrier gate is "U"-shaped and said ohmic contact is disposed within said "U"; and
    c) an insulating boundary disposed in front of said ohmic contact and said Schottky barrier gate relative to the propagation direction of the surface acoustic wave in said channel.

13. A device as in claim 12, wherein:
    a) said "U" has a base portion; and
    b) said insulating barrier has a width that subtends said base portion.

14. A device as in claim 13, wherein:
    a) said insulating barrier is in the shape of a pentagon with an apex pointing in the direction of propagation of the surface acoustic wave.

15. A device as in claim 11, wherein:

a) said ohmic contact and said Schottky barrier gate are each disposed transverse to said longitudinal axis of said channel.

16. A device as in claim 1, wherein:
a) said channel has a width;
b) said injecting means comprises first, second and third groups of ohmic contacts and Schottky barrier gates; and
c) each of said ohmic contacts and said Schottky barrier gates are arrayed along the width of said channel.

17. A device as in claim 16, wherein:
a) each of said ohmic contacts and said Schottky barrier gates are disposed parallel to said channel longitudinal axis in a staggered configuration.

18. A device as in claim 16, wherein:
a) each of said ohmic contacts and said Schottky barrier gates are disposed transverse to said channel longitudinal axis in a staggered configuration.

19. A device as in claim 1, wherein said preselecting means comprises:
a) a logic circuitry operably connected to each of said sensing means for addressing a selected one of said sensing means; and
b) tap switching circuitry operably connected to each of said sensing means and responsive to said logic circuitry for connecting the selected sensing means to said processing means.

20. A device as in claim 19, wherein:
a) said logic circuitry includes means for generating a negative current on a selected one of said sensing means and a positive current on the others of said sensing means whereby the sensing means with the negative current is the selected sensing means; and
b) said tap switching circuitry includes means responsive to the negative current to thereby connect the selected sensing means to said processing means.

21. A delay device, comprising:
a) a semi-conductor chip;
b) an acoustic charge transport channel disposed on said chip and having first and second opposite ends and a longitudinal axis;
c) an ohmic contact operably associated with said channel for injecting an electronic signal to said channel;
d) a drive transducer operably associated with said first end of said channel for converting an applied signal into a single frequency, large amplitude surface acoustic wave for propagating through said channel along a propagation direction from said first end to said second end for thereby transporting the electronic signal through said channel;
e) a Schottky barrier gate disposed adjacent and electrically coupled to said ohmic contact for controlling the injection of the electronic signal by said ohmic contact;
f) said Schottky barrier gate is "U"-shaped and said ohmic contact is disposed within said "U";
g) an insulating boundary disposed in front of said ohmic contact relative to the propagation direction of said surface acoustic wave;
h) at least one pick-up transducer operably associated with said channel for picking up the generated surface acoustic wave;
i) an amplifier having an output and an input connected to said drive transducer and said at least one pick-up transducer, respectively;
j) a plurality of electrodes operably associated with said channel and disposed along the propagation direction of the surface acoustic wave for non-destructively sensing the electronic signal as the electronic signal is transported by the surface acoustic wave;
k) means monolithically disposed on said chip and operably connected to said electrodes for preselecting any one of said electrodes, thereby extracting a delayed replica of the signal from said channel; and
l) means operably connected to said preselecting means for processing the extracted delayed replica of the signal for generating an output.

22. A device as in claim 21, wherein said preselecting means comprises:
a) logic circuitry operably connected to each of said electrodes for addressing a selected one of said electrodes; and
b) tap switching circuitry operably connected to each of said electrodes and responsive to said logic circuitry for connecting the selected electrode to said processing means.

23. A device as in claim 22, wherein:
a) said logic circuitry includes means for generating a negative current on a selected one of said electrodes and a positive current on the other electrodes whereby the electrode with the negative current is the selected electrode; and
b) said tap switching circuitry includes means responsive to the negative current thereby to connect the selected electrode to said processing means.

24. A device as in claim 21, wherein:
a) said pick-up transducer is disposed at said first end of said channel.

25. A device as in claim 21, wherein:
a) said at least one pick-up transducer comprises first and second pick-up transducers;
b) said first pick-up transducer is disposed at said first end of said channel;
c) said second pick-up transducer is disposed at said second end of said channel; and
d) said first and second pick-up transducers are connected to said amplifier input.

26. A device as in claim 21, wherein:
a) said ohmic contact is disposed parallel to said longitudinal axis of said channel.

27. A device as in claim 21, wherein:
a) said "U" has a base portion; and
b) said insulating barrier has a width that subtends said base.

28. A device as in claim 27, wherein:
a) said insulating barrier is in the shape of a pentagon with an apex pointing in the direction of propagation of the surface acoustic wave.

29. A device as in claim 21, wherein:
a) said pick-up transducer is disposed at said second end of said channel.

* * * * *